United States Patent [19]

Komori et al.

[11] Patent Number: 5,019,520
[45] Date of Patent: May 28, 1991

[54] METHOD FOR PREPARING A HIGH MOBILITY, LIGHTLY-DOPED CHANNEL MIS-TYPE FET WITH REDUCED LATCH UP AND PUNCHTHROUGH

[75] Inventors: Shigeki Komori; Shigeru Kusunoki; Katsuhiro Tsukamoto, all of Hyogo, Japan

[73] Assignee: Mitsubishi Denki Kabushiki Kaisha, Tokyo, Japan

[21] Appl. No.: 516,643

[22] Filed: Apr. 30, 1990

[30] Foreign Application Priority Data

Nov. 29, 1989 [JP] Japan ................................. 1-311264

[51] Int. Cl.⁵ ......................................... H01L 21/334
[52] U.S. Cl. ...................................... 437/26; 437/29; 437/45; 437/27; 437/34
[58] Field of Search ....................... 437/26, 29, 45, 27, 437/34

[56] References Cited

U.S. PATENT DOCUMENTS 3,289,504  2/1974  Jaddam ................................. 437/45
4,354,307  10/1982 Vinson et al. ......................... 437/27
4,734,382  3/1988  Krishna ................................. 437/26

Primary Examiner—Brian E. Hearn
Assistant Examiner—Gordon V. Hugo
Attorney, Agent, or Firm—Lowe, Price, LeBlanc, Becker & Shur

[57] ABSTRACT

A method for preparing a MISFET of a minute size with the channel length of not more than 2 μm between a source and a drain, comprises the steps of forming a mask for exposing a region for forming a well on a planar surface of a semiconductor substrate, and introducing ions at a predetermined energy into the well region by using the mask. The predetermined energy is such as to form a peak of the impurity concentration distribution at a position deeper than the bottom surface of the source and the drain and to maintain the layer of at least a partial layer of the channel at an impurity concentration lower than $10^{16} cm^{-3}$ so that a high speed carrier movement in the channel is provided without causing a punch-through phenomenon.

12 Claims, 9 Drawing Sheets

METHOD FOR PREPARING A HIGH MOBILITY, LIGHTLY-DOPED CHANNEL MIS-TYPE FET WITH REDUCED LATCH UP AND PUNCHTHROUGH

BACKGROUND OF THE INVENTION

1. Field of the Invention

This invention relates to a method for preparing a metal-insulator-semiconductor (MIS) type field effect transistor (FET). More particularly, it relates to a minute size MIS type FET having a short channel between a source and a drain.

2. Description of the Background Art

Referring to a diagrammatic sectional view of FIG. 4, a punch-through phenomenon in a FET is explained. In this figure, on raising a voltage applied across a drain 10b and a source 10a of a second conductivity type formed on a semiconductor substrate 1 of a first conductivity type, widths of depletion layers 15a and 15b are increased. The widths of the layers 15a and 15b are increased particularly in a deeper region where the effect of the voltage of the gate electrode 8 becomes extinct. If the depletion layer 15b on the drain side and the depletion layer 15a on the source side connect to each other at a region deeper than a channel layer 9, the carriers flow from the source 10a to the drain 10b through the depletion layers, as shown by an arrow. Thus the punch-through phenomenon means the flow of carriers which can not be controlled by the gate electrode 8 and which proceeds from the source 10a towards the drain 10b through a region deeper than the channel layer 9.

The source 10a and the drain 10b usually have a high impurity concentration of approximately $10^{20}$ cm$^{-3}$, whereas the substrate 1 has a low impurity concentration of approximately $10^{15}$ cm$^{-3}$. Thus the depletion layer spreads wider on the substrate side in the vicinity of each boundary of the source 10a and the drain 10b.

As may be seen from FIG. 4, the punch-through phenomenon is most likely to occur when the channel 9 is of shorter length and the source 10a and the drain 10b are closer to each other. That is, a small size FET with a short channel length is more susceptible to the punch-through phenomenon. A demand exists, however, for a smaller and smaller size FET for raising the degree of integration of semiconductor IC devices. Thus the small size FET having a channel length less than 2 μm is formed within a well formed in a substrate and having an impurity concentration higher than that of the substrate. The high impurity concentration in the well acts to reduce the widths of the depletion layers in the vicinity of the boundaries of the source and the drain to suppress the punch-through phenomenon.

Referring to FIGS. 5A to 5G, an example of the conventional method for producing the small-size FET is explained.

First referring to FIG. 5A, an oxide film 2 is formed by thermal oxidation on a major surface of a silicon substrate 1. A nitride film 3 is formed by a chemical vapor deposition (CVD) method on the oxide film 2. A first conductivity type impurity layer 11 for forming the well is formed by implanting impurity ions through both the nitride film 3 and the oxide film 2.

Referring to FIG. 5B, impurities in the impurity layer 11 are driven to a depth of 4 to 5 μm by diffusion by a heat treatment at a high temperature of 1180° C. for six hours or more, to form a well 11a having an impurity concentration higher than that of the substrate 1.

Referring to FIG. 5C, the nitride film 3 is patterned using a resist mask 4 to form a nitride pattern 3a to expose partial areas of the oxide layer 2. Impurity ions are implanted through the exposed partial area of the oxide film 2 to form a high concentration impurity region 12 of the first conductivity type.

Referring to FIG. 5D, after removal of the resist mask 4, a field oxide film 2a is formed by thermal oxidation using the nitride film pattern 3a as a mask. The nitride film pattern 3a is then removed simultaneously with the oxide film 2 thereunder. The high concentration impurity region 12a remaining below the field oxide film 2a acts to cut a parasitic channel below the field oxide film 2a.

Referring to FIG. 5E, a channel dope layer 7 of the first conductivity type is formed in the vicinity of the surface of the well 11a by ion implantation at a lower energy. The function of the channel dope layer 7 is to control the threshold voltage of the FET. A gate oxide film 13 is then formed on the surface of the well 11a.

Referring to FIG. 5F, an electrically conductive layer is deposited on the gate oxide film 13 by a CVD or vacuum evaporation method and the conductivity layer is then patterned to form a gate electrode 8.

Referring to FIG. 5G, impurities are introduced by ion implantation using the gate electrode and the field oxide film 2a as a mask to form source and drain regions 10 of a second conductivity type. In this manner, a minute size MISFET is formed within the well 11a.

The impurity concentration distribution in the silicon substrate 1 in the cross-section taken along a line 6A—6A in FIG. 5G is shown in FIG. 6A, wherein the abscissa denotes the depth (μm) from the surface of the substrate 1 and the ordinate the impurity concentration (cm$^{-3}$). The concentration peak shown by an arrow 7 near the surface of the substrate 1 represents the impurity concentration in the channel dope layer 7. The region indicated by an arrow 11a represents the impurity concentration distribution in the well 11a. The region indicated by an arrow 1 represents the impurity concentration in the substrate 1 itself.

FIG. 6B is similar to FIG. 6A but shows the impurity concentration in the sectional plane taken along a line 6B—6B in FIG. 5G. A straight vertical line shown by an arrow 2a indicates the bottom surface of the field oxide film 2a. The concentration peak beneath the bottom of the field oxide film 2a, indicated by an arrow 12a, represents an impurity concentration distribution in a channel cut region 12a.

Referring to FIG. 7, there is shown the effect of the impurity concentration on the carrier mobility in the silicon. The abscissa represents the total impurity concentration (cm$^{-3}$) and the ordinate the mobility (cm$^{-2}$/v.sec). A curve 7A shows the electron mobility and a curve 7B the hole mobility. As described hereinabove, a well having a high impurity concentration is desirable to prevent the punch-through phenomenon effectively in the small size FET. However, as may be seen from FIG. 6A, if the impurity concentration in the well 11a is increased, the impurity concentration in the channel layer 9 is also increased inevitably. In this case, as may be seen from FIG. 7, the carrier mobility in the channel 9 is lowered, and then the operating speed of the FET is lowered. Particularly, when the total impurity concentration becomes higher than $10^{16}$ cm$^{-3}$, the carrier mobility is lowered abruptly.

As described hereinabove, the conventional method for preparing the FET suffers from an inconvenience that the impurity concentration in the well must be increased to reduce the size of the FET and, on the other hand, if the impurity concentration in the well is increased, the operating speed of the FET is lowered.

SUMMARY OF THE INVENTION

It is therefore an object of the present invention to provide a method for preparing a minute size FET less susceptible to a punch-through phenomenon and having a high switching speed.

The present invention provides a method for preparing a MISFET of a minute size with the channel length between a source and a drain of not more than 2 μm, comprising the steps of forming a mask exposing a region for forming a well on a planar surface of a semiconductor substrate, and introducing impurity ions at a predetermined energy into the well region by using the mask, the predetermined energy level being such as to form a peak of the impurity concentration distribution at a position deeper than the bottom surface of the source and the drain and to maintain at least a partial layer of the channel at an impurity concentration lower than $10^{16}$ cm$^{-3}$.

According to the method for preparing the MISFET of the present invention, a minute size FET which is less susceptible to a punch-through phenomenon and which has a high switching speed may be produced, since the impurity concentration in the well may be raised by ion implantation without raising the impurity concentration in the channel layer.

The foregoing and other objects, features, aspects and advantages of the present invention will become more apparent from the following detailed description of the present invention when taken in conjunction with the accompanying drawings.

DESCRIPTION OF THE PREFERRED

Referring to FIGS. 1A to 1F, a method for preparing a minute size FET according to an embodiment of the present invention is explained in detail.

Figure 1A:
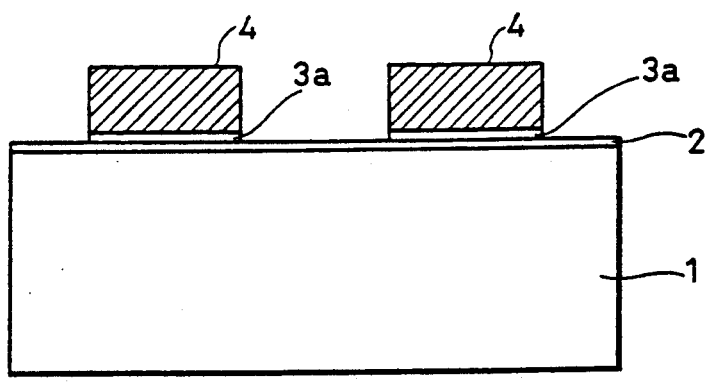
FIGS. 1A to 1F are diagrammatic sectional views for illustrating the method for preparing the minute size MISFET according to an embodiment of the present invention.

Referring first to FIG. 1A, a thermally oxidized film 2 is formed on a planar surface of a first conductivity type silicon substrate 1. A nitride film is formed on the thermally oxidized film 2 by the CVD method and patterned using a resist mask 4 to form a nitride film pattern 3a.

Figure 1B:
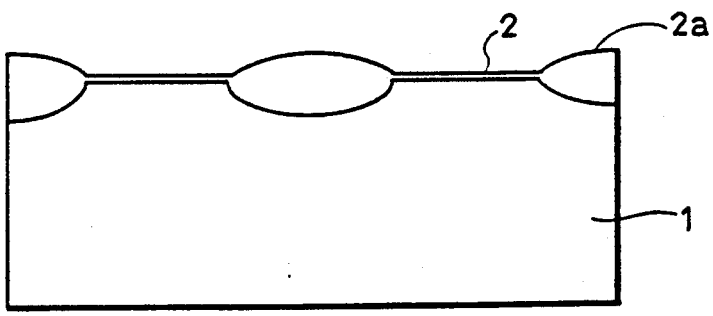

Referring to FIG. 1B, after the resist mask 4 is removed, thermal oxidation is performed, using the nitride film pattern 3a as a mask, to form a field oxide film 2a. The nitride film pattern 3a is then removed.

Figure 1C:
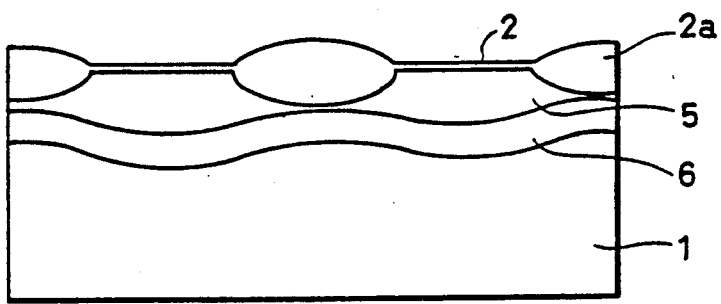

Referring to FIG. 1C, with the thermally oxidized film 2 of 300Å in thickness and the with the field oxidized film 2a of 5000Å in thickness, impurities are introduced by ion implantation into the silicon substrate 1, using a high energy of not less than 200 KeV and at a dosage of about $2 \times 10^{12}$ cm$^{-2}$, for forming a first high impurity concentration layer 5 of the first conductivity type. Then, using a higher level energy and at a higher dosage of about $1 \times 10^{13}$ cm$^{-2}$, impurities are introduced by ion implantation, for forming a second high impurity concentration layer 6 of the first conductivity type having a higher impurity concentration under the first high impurity concentration layer 5. These first and second high impurity concentration layers 5, 6 constitute a high impurity concentration well.

Figure 1D:
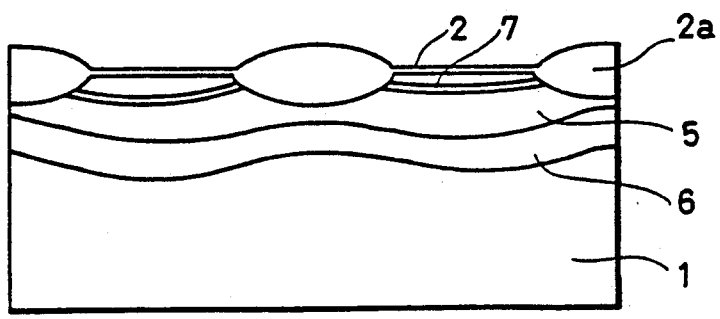

Referring to FIG. 1D, impurity ions are introduced, using a lower level energy, for forming a first conductivity type channel dope layer 7 adapted for controlling the threshold voltage of the FET, at a position shallower than the first impurity concentration layer 5.

Figure 1E:
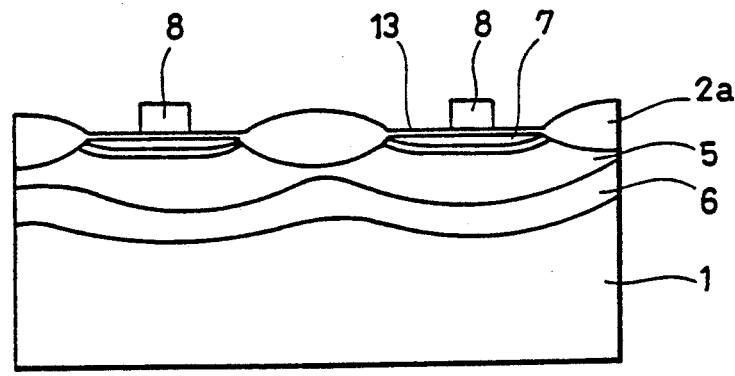

Referring to FIG. 1E, after the thermally oxidized layer 2 is removed, a gate oxide film 13 having a thickness of about 100 to 200Å is formed by thermal oxidation. An electrically conductive layer is deposited on the gate oxide film 13 by a CVD or vacuum evaporation method and patterned to form a gate electrode 8.

Figure 1F:
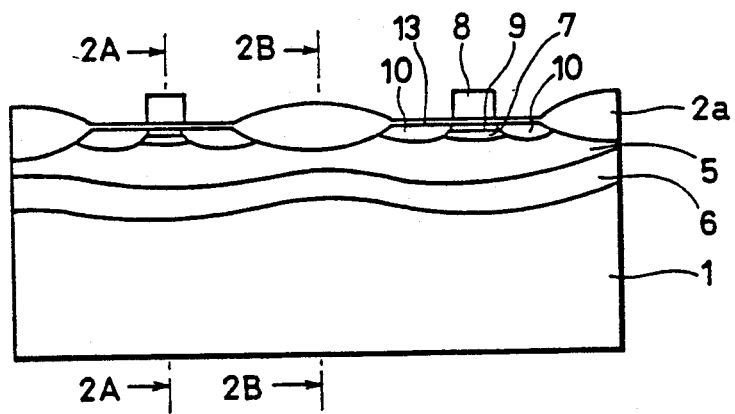

Referring to FIG. 1F, impurities are introduced by ion implantation using the gate electrode 8 and the field oxide film 2a as a mask, for forming source and drain regions 10 of a second conductivity type. In this manner, a minute size MISFET is formed.

Figure 2A:
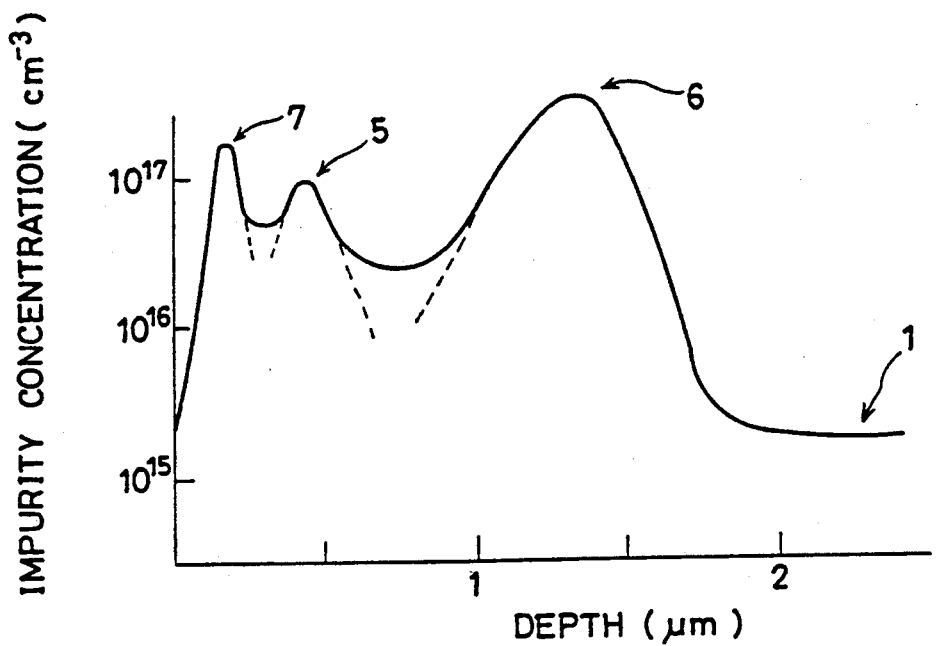
FIG. 2A shows the impurity concentration distribution in a cross-section taken along a line 2A—2A in FIG. 1F.
Figure 6A:
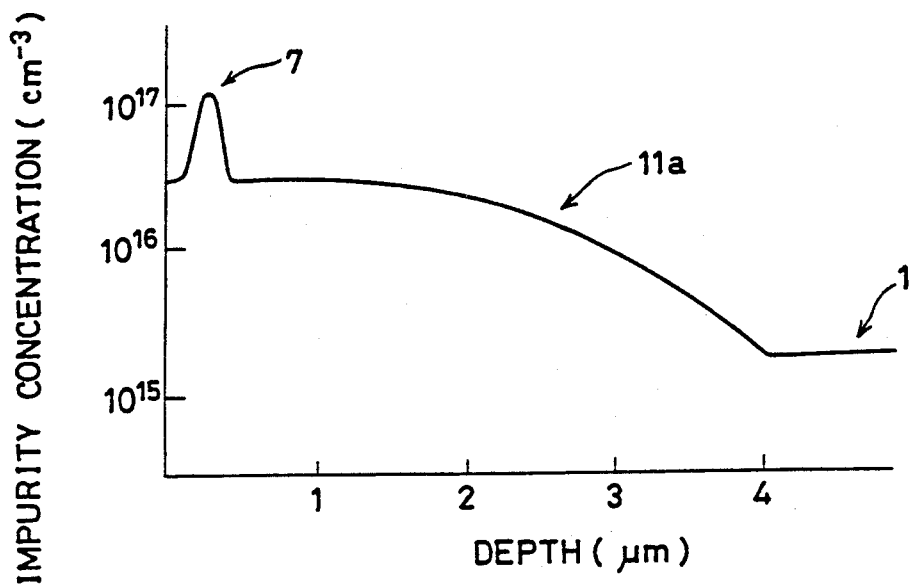
FIGS. 6A shows the impurity concentration distribution in a cross-section taken along a line 6A—6A in FIG. 5G.
Figure 6B:
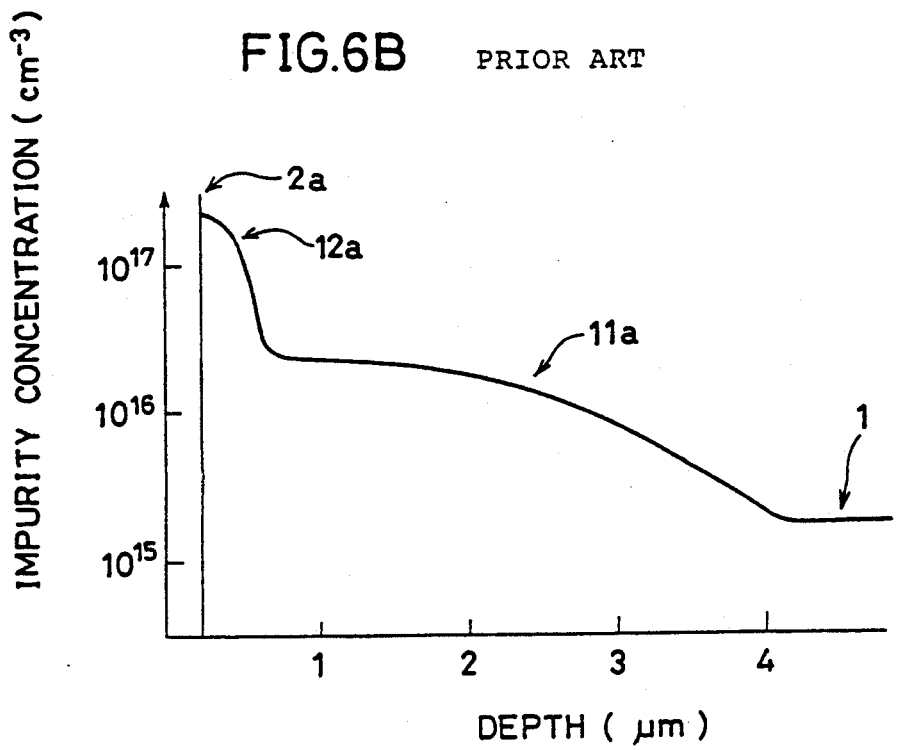
FIG. 6B shows the impurity concentration distribution in a cross-section taken along a line 6B—6B in FIG. 5G.

FIG. 2A shows the impurity concentration distribution in the substrate 1 in a cross-section taken along a line 2A—2A in FIG. 1F. The abscissa shows the depth (μm) from the surface of the substrate 1 and the ordinate shows the impurity concentration (cm$^{-3}$). The concentration peak at the shallowest point, shown by an arrow 7, represents the impurity concentration distribution in the channel dope layer 7. The second concentration peak at a position deeper than the channel dope layer 7, shown by an arrow 5, represents the impurity concentration distribution in the first high impurity concentration layer 5. The impurity concentration in this first high concentration impurity layer 5 is higher than that in the well 11a in FIG. 6A and prevents the punch-through phenomenon more effectively.

The third concentration peak at a position deeper than the first high impurity concentration layer 5, shown by an arrow 6, represents the impurity concentration distribution in the second high impurity concentration layer 6. When only FETs having the same conductivity type channels are formed on a substrate, this second high impurity concentration layer 6 may be omitted. However, in a complementary MISFET device in which FETs having different conductivity types are formed on the same substrate, the second high impurity concentration layer 6 functions to prevent the latch-up phenomenon. This latch-up phenomenon is described in detail in "VSLI TECHNOLOGY" edited by S. M. Sze, published by McGraw Hill International Company. In the complementary MISFET device, the substrate 1 of the first conductivity type also includes a second conductivity type well including a channel dope layer 7 of the second conductivity type and first and second high impurity concentration layers 5, 6 of the second conductivity type, in which a FET having first conductivity type source and drain 10 is formed.

Figure 2B:
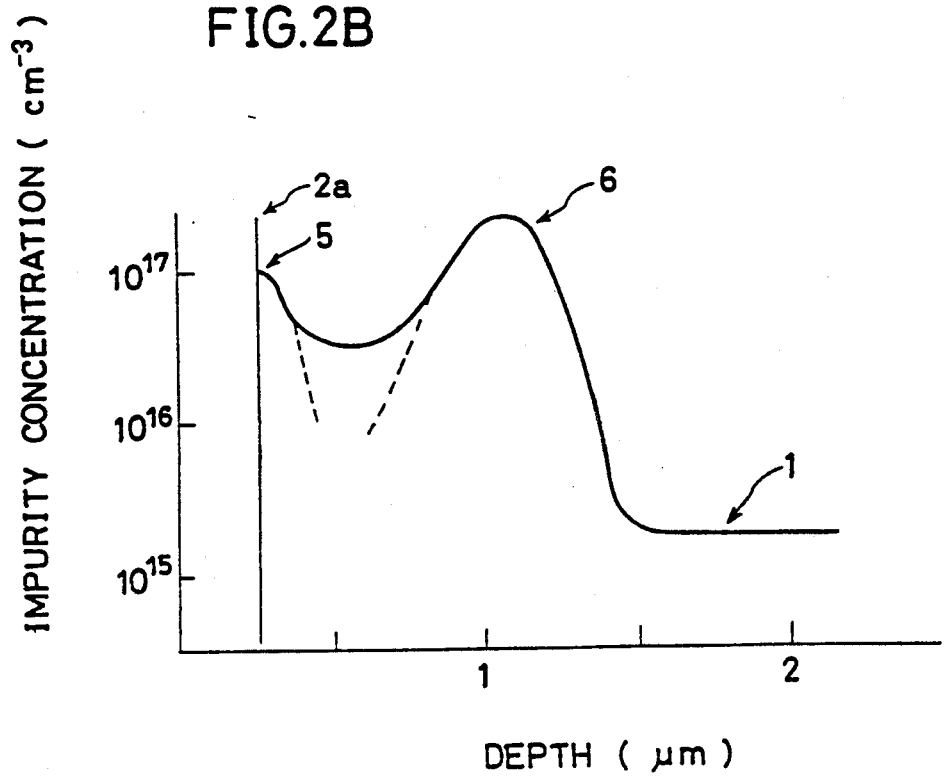
FIG. 2B shows the impurity concentration distribution in a cross-section taken along a line 2B—2B in FIG. 1F.

FIG. 2B is similar to FIG. 2A but shows the impurity concentration distribution in a cross-section taken along a line 2B—2B in FIG. 1F. A straight vertical line shown by an arrow 2a indicates the bottom surface of the field oxide film 2a. The concentration peak beneath the bottom surface of the field oxide film 2a, shown by an arrow 5, represents the impurity concentration distribution in the first high impurity concentration region 5. That is, the first high impurity concentration region 5 functions as a channel cutting region also.

Figure 3A:
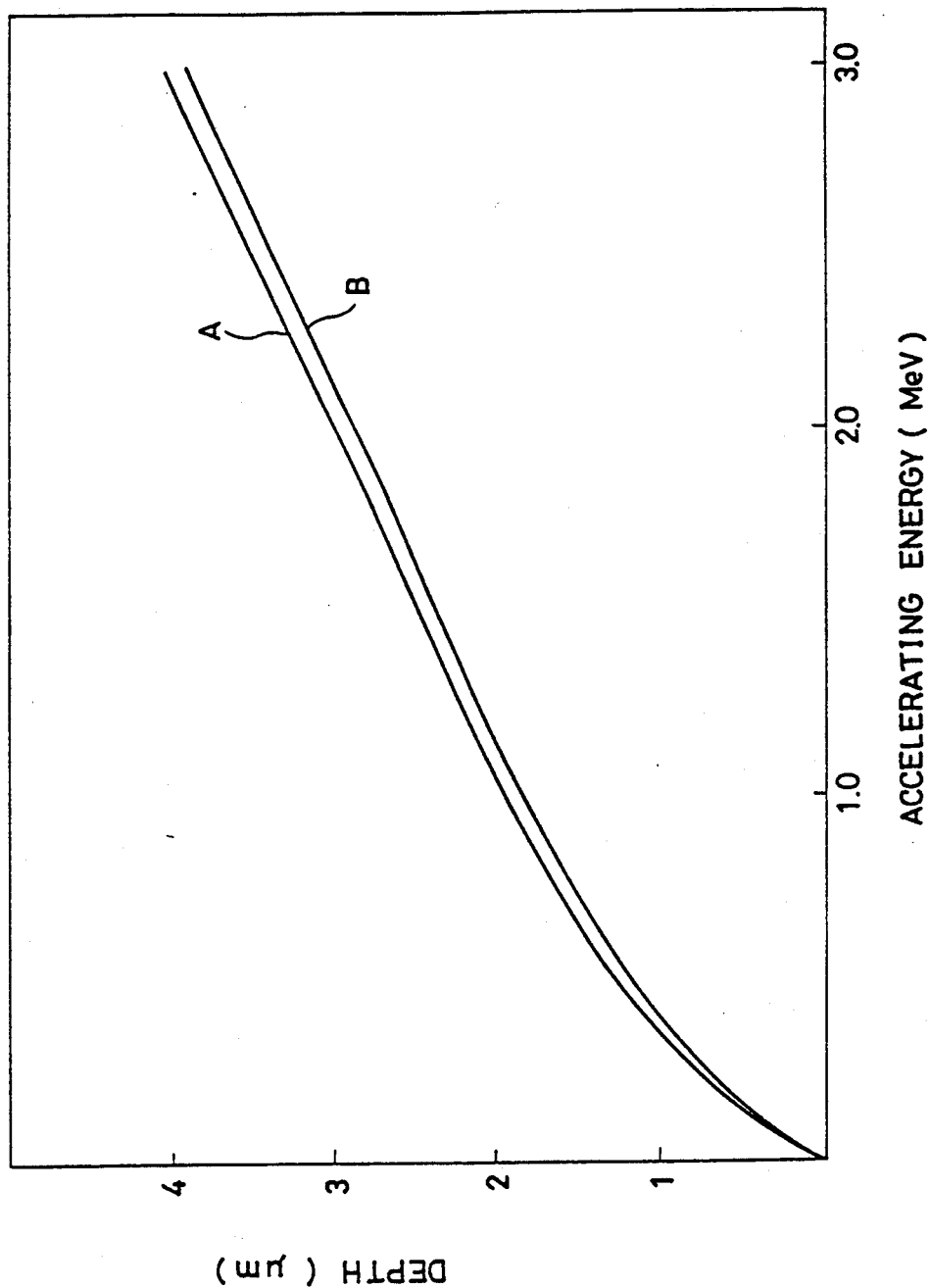
FIGS. 3A and 3B show the relation between the ion accelerating voltage and the depth of the concentration peak of the implanted ions.

FIG. 3A shows the relation between the energy level for accelerating boron ions and the depth of the concentration peak of the implanted ions. The abscissa shows the level of the accelerating energy (MeV) and the ordinate shows the depth of the concentration peak ($\mu$m). The curve A represents boron introduced into $SiO_2$ and a curve B represents boron introduced into silicon.

Figure 3B:
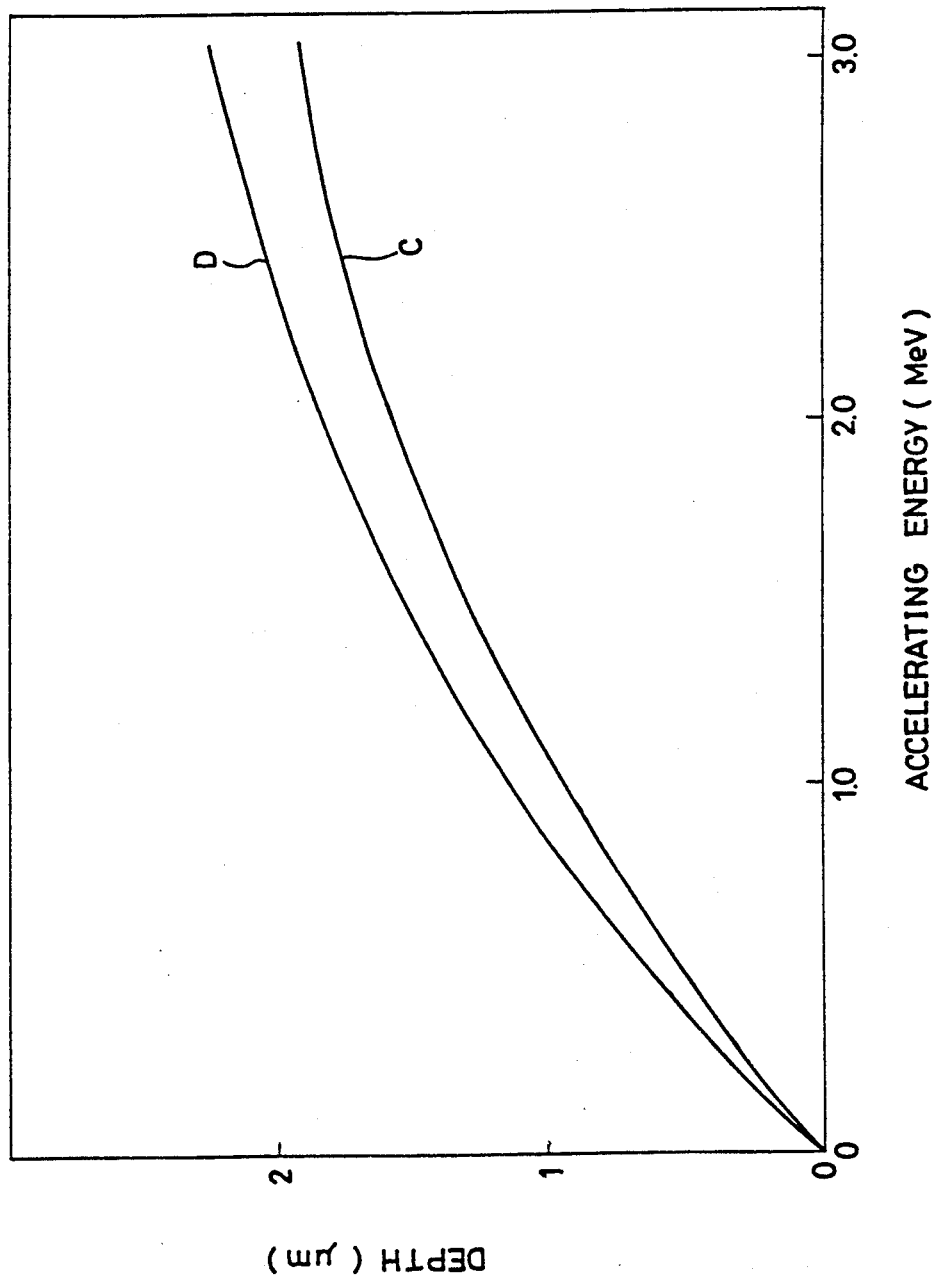
Figure 4:
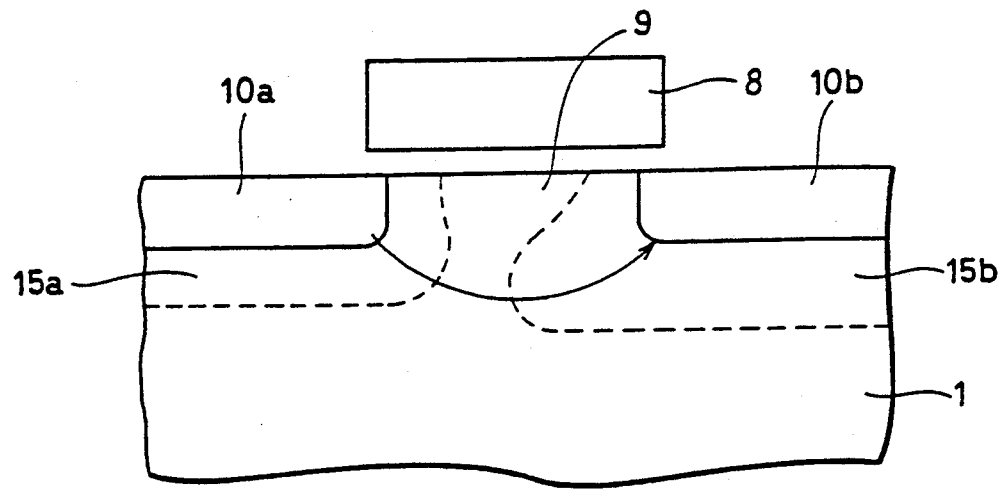
FIG. 4 is a diagrammatic cross-sectional view for illustrating the punch-through phenomenon in the FET.
Figure 7:
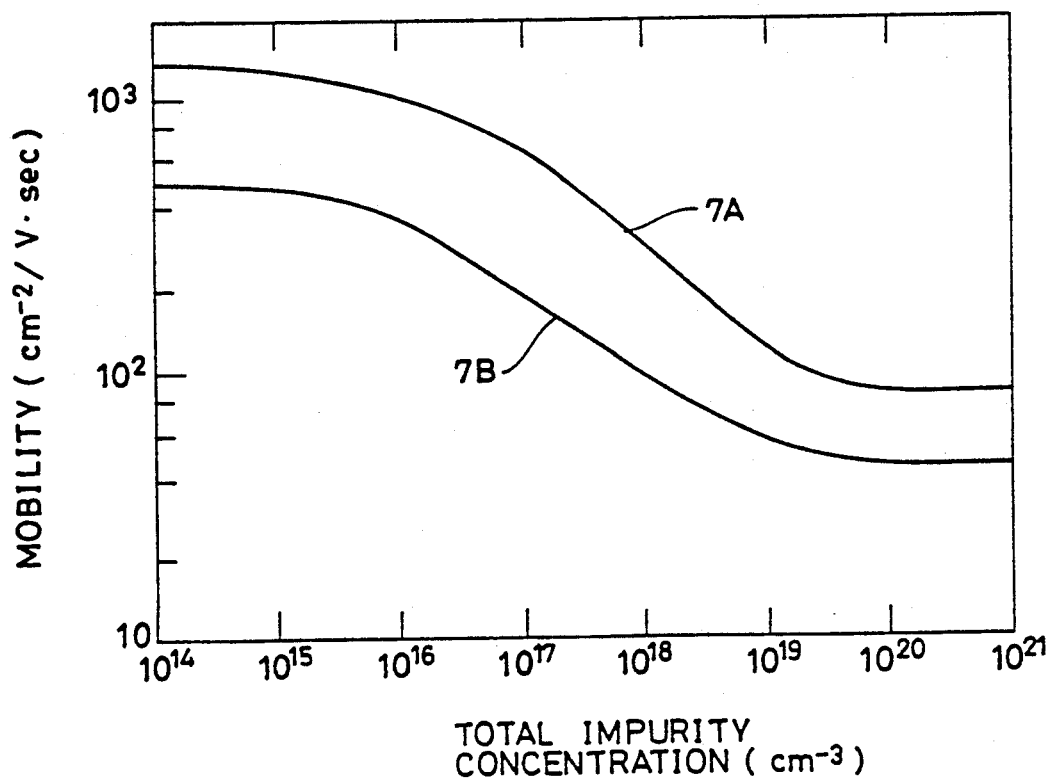
FIG. 7 shows the effect of the total impurity concentration on the carrier mobility.
Figure 5A:
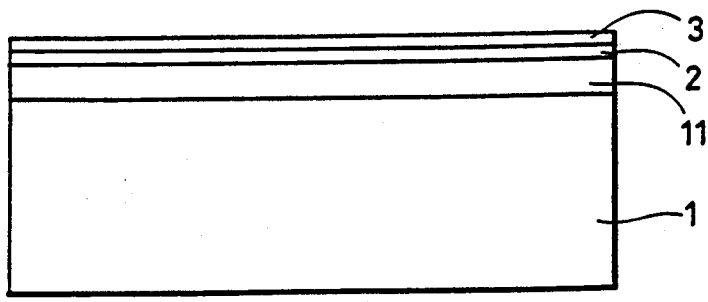
FIGS. 5A to 5G are diagrammatic cross-sectional views for illustrating a method for preparing a conventional minute size MISFET.
Figure 5B:
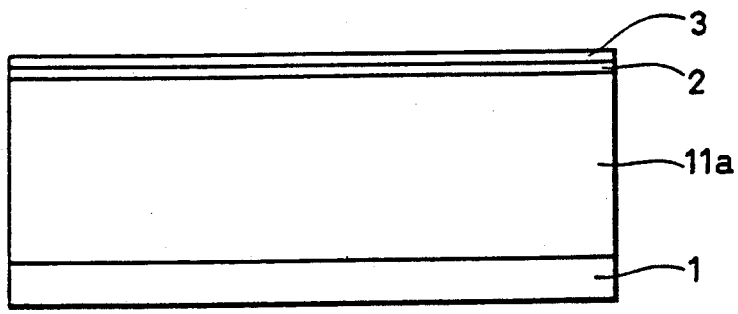
Figure 5C:
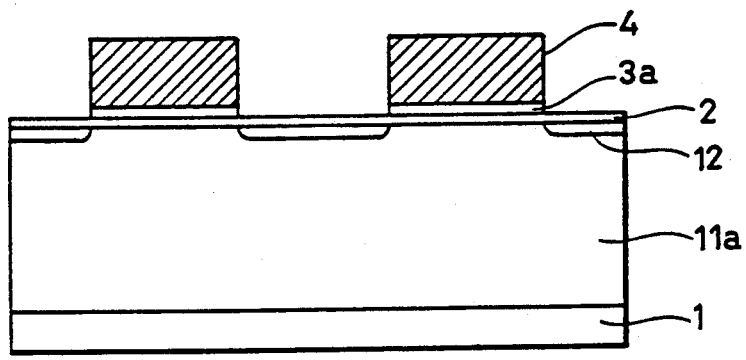
Figure 5D:
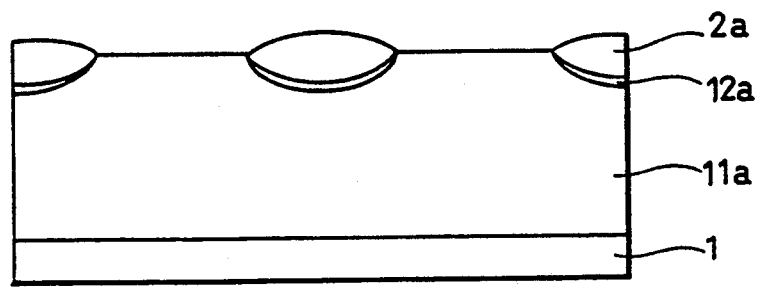
Figure 5E:
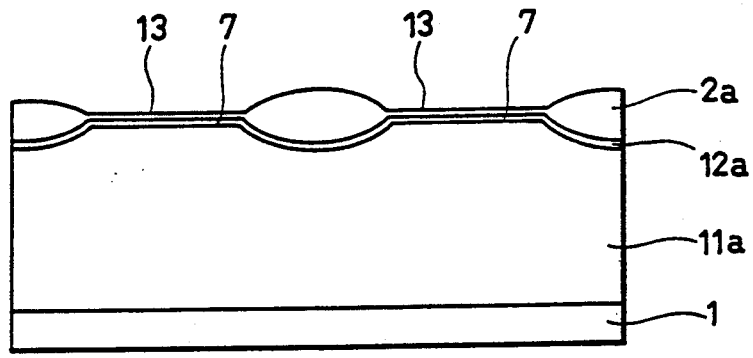
Figure 5F:
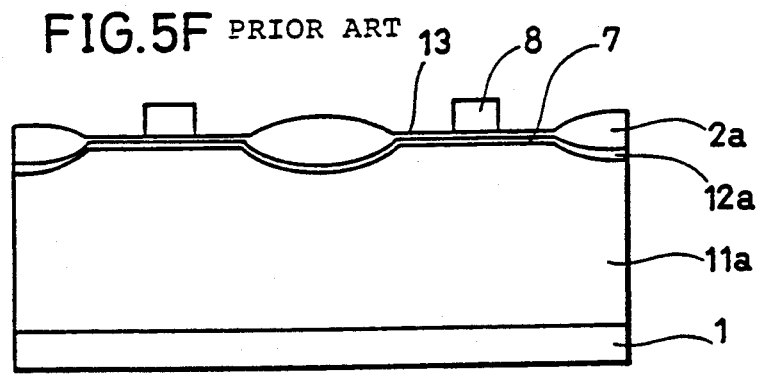
Figure 5G:
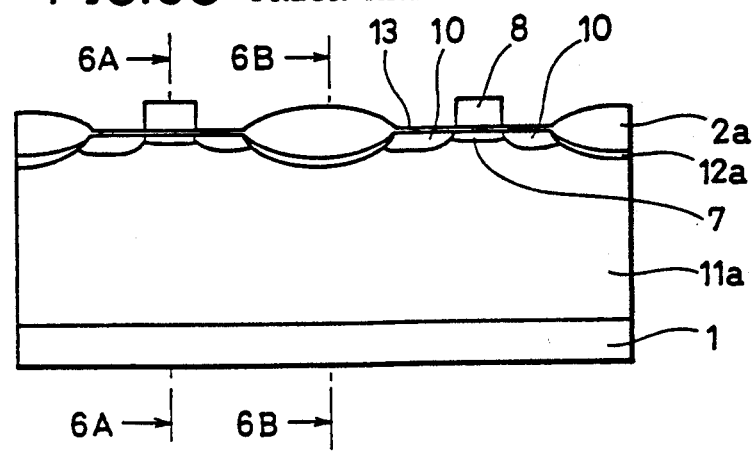

FIG. 3B is similar to FIG. 3A, but a curve C represents phosphorus introduced by ion implantation and a curve D represents phosphorus introduced into silicon.

As may be seen from FIGS. 3A and 3B, the depth of the concentration peak of introduced ions may be controlled by the accelerating energy level. Thus it will be understood that, in the embodiment shown in FIGS. 1A to 1F, the channel dope layer 7 and the first and second high impurity concentration layers 9, 6 can be formed at desired depths. The relation between the accelerating voltage and the depth of ion concentration peak in the case of introducing ions into a certain substance may be determined by a relatively easy test.

From the foregoing it is seen that the present invention provides a method for preparing a minute size FET less susceptible to the punch-through phenomenon and having a high switching speed because the impurity concentration in the well may be increased by ion implantation without increasing the impurity concentration in the channel layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for making a MISFET having a channel length of not more than 2 $\mu$m between a source and a drain, comprising the steps of:
    forming a mask for exposing a region for forming a well on a planar surface of a semiconductor substrate; and
    introducing impurity ions at a predetermined energy into said well region by using said mask;
    said predetermined energy includes a plurality of energy levels so as to form peaks of the impurity concentration distribution at positions deeper than the bottom surface of said source and said drain and to maintain at least a partial layer of said channel at a low impurity concentration to enable a high speed carrier movement in said channel;
    a first one of said energy levels causing a first peak of said impurity concentration distribution adjacent to the bottom of said channel, said first peak acting to control the threshold voltage of said MISFET, and a second one of said energy levels causing a second peak of the impurity concentration distribution at a position deeper than said first peak, said second peak acting to suppress the punch-through phenomenon in said MISFET.

2. The method according to claim 1 wherein said predetermined energy includes a third one of said energy levels causing a third peak of said impurity concentration distribution at a position deeper than said second peak, said third peak acting to prevent a latch-up phenomenon of said MISFET.

3. The method according to claim 1 wherein said predetermined energy is changed continuously from said first energy level to said second energy level.

4. The method according to claim 1, wherein said predetermined level is changed continuously from said second energy level to said first energy level.

5. The method according to claim 2, wherein said predetermined energy is changed continuously from said first energy level to said third energy level.

6. The method according to claim 2, wherein said predetermined energy is changed continuously from said third energy level to said first energy level.

7. A method of making a MISFET having a channel length of not more than 2 $\mu$m between a source and a drain, comprising the steps of
    forming a mask for exposing a region for forming a well on a planar surface of a semiconductor substrate, and
    introducing impurity ions at predetermined energy levels into said well region by using said mask,
    continuously changing the energy from one of the predetermined energy levels to another of the predetermined energy levels,
    said predetermined energy levels being such as to produce peaks of the impurity concentration distribution at positions deeper than the bottom surface of said source and said drain and to maintain at least a partial layer of said channel at a low impurity concentration to enable a high speed carrier movement in said channel without causing a punch-through phenomenon.

8. The method according to claim 7 wherein the low impurity concentration in said partial layer of said channel is lower than $10^{16}$ cm$^{-3}$.

9. A method for making a MISFET of a minute size having a channel length of not more than 2 $\mu$m between a source and a drain, comprising the steps of:
    forming a mask for exposing a region for forming a well on a planar surface of a semiconductor substrate; and
    introducing impurity ions at a predetermined energy into said well region by using said mask;
    said predetermined energy includes a plurality of energy levels so as to form peaks of the impurity concentration distribution at positions deeper than the bottom surface of said source and said drain and to maintain at least a partial layer of said channel at an impurity concentration lower than $10^{16}$ cm$^{-3}$ to enable a high speed carrier movement in said channel;

a first one of said energy levels causing a first peak of said impurity concentration distribution adjacent to the bottom of said channel, said first peak acting to control the threshold voltage of said MISFET, and a second one of said energy levels causing a second peak of the impurity concentration distribution at a position deeper than said first peak, said second peak acting to suppress the punch-through phenomenon in said MISFET;

wherein said predetermined energy is changed continuously from said first energy level to said second energy level.

10. A method for making a MISFET of a minute size having a channel length of not more than 2 μm between a source and a drain, comprising the steps of:

forming a mask for exposing a region for forming a well on a planar surface of a semiconductor substrate; and introducing impurity ions at a predetermined energy into said well region by using said mask;

said predetermined energy includes a plurality of energy levels so as to form peaks of the impurity concentration distribution at positions deeper than the bottom surface of said source and said drain and to maintain at least a partial layer of said channel at an impurity concentration lower than $10^{16}$ cm$^{-3}$ to enable a high speed carrier movement in said channel;

a first one of said energy levels causing a first peak of said impurity concentration distribution adjacent to the bottom of said channel, said first peak acting to control the threshold voltage of said MISFET, and a second one of said energy levels causing a second peak of the impurity concentration distribution at a position deeper than said first peak, said second peak acting to suppress the punch-through phenomenon in said MISFET;

wherein said predetermined energy is changed continuously from said second energy level to said first energy level.

11. A method for making a MISFET of a minute size having a channel length of not more than 2 μm between a source and a drain, comprising the steps of:

forming a mask for exposing a region for forming a well on a planar surface of a semiconductor substrate; and introducing impurity ions at a predetermined energy into said well region by using said mask;

said predetermined energy includes a plurality of energy levels so as to form peaks of the impurity concentration distribution at positions deeper than the bottom surface of said source and said drain and to maintain at least a partial layer of said channel at an impurity concentration lower than $10^{16}$ cm$^{-3}$ to enable a high speed carrier movement in said channel;

a first one of said energy levels causing a first peak of said impurity concentration distribution adjacent to the bottom of said channel, said first peak acting to control the threshold voltage of said MISFET, and a second one of said energy levels causing a second peak of the impurity concentration distribution at a position deeper than said first peak, said second peak acting to suppress the punch-through phenomenon in said MISFET;

wherein said predetermined energy includes a third one of said energy levels causing a third peak of said impurity concentration distribution at a position deeper than said second peak, said third peak acting to prevent a latch-up phenomenon of said MISFET;

and wherein said predetermined energy is changed continuously from said first energy level to said third energy level.

12. A method for making a MISFET of a minute size having a channel length of not more than 2 μm between a source and a drain, comprising the steps of:

forming a mask for exposing a region for forming a well on a planar surface of a semiconductor substrate; and introducing impurity ions at a predetermined energy into said well region by using said mask;

said predetermined energy includes a plurality of energy levels so as to form peaks of the impurity concentration distribution at positions deeper than the bottom surface of said source and said drain and to maintain at least a partial layer of said channel at an impurity concentration lower than $10^{16}$ cm$^{-3}$ to enable a high speed carrier movement in said channel;

a first one of said energy levels causing a first peak of said impurity concentration distribution adjacent to the bottom of said channel, said first peak acting to control the threshold voltage of said MISFET, and a second one of said energy levels causing a second peak of the impurity concentration distribution at a position deeper than said first peak, said second peak acting to suppress the punch-through phenomenon in said MISFET;

wherein said predetermined energy includes a third one of said energy levels causing a third peak of said impurity concentration distribution at a position deeper than said second peak, said third peak acting to prevent a latch-up phenomenon of said MISFET;

and wherein said predetermined energy is changed continuously from said third energy level to said first energy level.

* * * * *